United States Patent
Lyles et al.

(10) Patent No.: US 7,999,558 B2
(45) Date of Patent: Aug. 16, 2011

(54) SYSTEMS AND METHODS OF OVERVOLTAGE AND UNDERVOLTAGE DETECTION

(75) Inventors: Umar Jameer Lyles, Palm Bay, FL (US); Karthik Kadirvel, Melbourne, FL (US); John H. Carpenter, Jr., Palm Bay, FL (US)

(73) Assignee: Texas Instruments Incorporated, Dallas, TX (US)

( * ) Notice: Subject to any disclaimer, the term of this patent is extended or adjusted under 35 U.S.C. 154(b) by 243 days.

(21) Appl. No.: 12/399,361

(22) Filed: Mar. 6, 2009

(65) Prior Publication Data

US 2010/0225300 A1    Sep. 9, 2010

(51) Int. Cl.
*G01R 19/00* (2006.01)
(52) U.S. Cl. ........................ 324/522; 324/500
(58) Field of Classification Search ............ 324/522, 324/76.11
See application file for complete search history.

(56) References Cited

U.S. PATENT DOCUMENTS

2008/0042632 A1* 2/2008 Chapuis et al. ............... 323/283

* cited by examiner

*Primary Examiner* — Vincent Q Nguyen
(74) *Attorney, Agent, or Firm* — William B. Kempler; Wade J. Brady, III; Frederick J. Telecky, Jr.

(57) ABSTRACT

Systems and methods for overvoltage and undervoltage detection may be implemented with a fully differential circuit that includes a coarse comparator and a band gap based fine comparator. The coarse comparator may determine if the battery is closer to an OV condition or an UV condition. Based on the output of the coarse comparator, the trip point of the fine comparator is adjusted. The outputs of both comparators are pull-up circuits whose output is decoded to determine if an OV or a UV condition has occurred. The systems and methods accomplish valid circuit outputs even when the voltage across the battery reduces to zero volts. This may be achieved by using an active low signal for the UV condition and an active high signal for the OV condition. Thus, when the battery voltage goes to zero, the circuit evaluates to the correct output.

20 Claims, 4 Drawing Sheets

US 7,999,558 B2

SYSTEMS AND METHODS OF OVERVOLTAGE AND UNDERVOLTAGE DETECTION

TECHNICAL FIELD

The present disclosure is generally related to electronics and, more particularly, is related to over voltage and under voltage detection.

BACKGROUND

In its broadest sense, power quality is a set of boundaries that allows electrical systems to function in their intended manner without significant loss of performance or life. The term is used to describe electric power that drives an electrical load and the load's ability to function properly with that electric power. Without the proper power, an electrical device (or load) may malfunction, fail prematurely or not operate at all. There are many ways in which electric power can be of poor quality and many more causes of such poor quality power. While "power quality" is a convenient term for many, it is the quality of the voltage—rather than power or electric current—that is actually described by the term.

When the voltage in a circuit or part of it is raised above its upper design limit, this is known as overvoltage. The conditions may be hazardous. Depending on its duration, the overvoltage event can be permanent or transient, the latter case also being known as a voltage spike. Electronic and electrical devices are designed to operate at a certain maximum supply voltage, and considerable damage can be caused by voltage that is higher than that for which the devices are rated.

Man-made sources of spikes are usually caused by electromagnetic induction when switching on or off inductive loads (such as electric motors or electromagnets), or by switching heavy resistive AC loads when zero-crossing circuitry is not used—anywhere where a large change of current takes place. One of the purposes of electromagnetic compatibility compliance is to eliminate such sources. Several devices have been devised to implement overvoltage protection, including, but not limited to arcing horns, zener diodes, avalanche diodes, transit, trisil, spark gaps, gas filled tubes, metal oxide varistors, and SiBar thyristors.

"Undervoltage" may be defined by many values, but a standard definition of undervoltage occurs when the nominal supplied voltage drops below a specified level, for example, 90% of nominal value. A decrease in supply voltage below 90% of the nominal value may destroy the contents of memory and internal registers, as well as cause software malfunction, which may fall into an infinite software loop state without activating the reset circuit. "Overvoltage" may be defined by many values, but a standard definition of overvoltage occurs when the nominal supplied voltage rises above a specified level, for example, 110% of nominal value. In a system with a Li-ion battery, for example, over voltage may cause catastrophic failure of the battery. There are many circuits to detect an overvoltage condition. And there are many other circuits that detect an undervoltage condition.

SUMMARY

Example embodiments of the present disclosure provide systems of overvoltage and undervoltage detection. Briefly described, in architecture, one example embodiment of the apparatus, among others, can be implemented as follows: a reference circuit for setting a reference voltage; a voltage input electrically coupled to the band gap circuit; a coarse comparator electrically connected to the reference circuit, the coarse comparator for determining if the voltage input is closer to an OV condition or a UV condition; a resistor divider for setting a reference voltage for the coarse comparator; and a pull up circuit for presenting an output of the reference circuit, the output of the reference circuit indicative of whether the input voltage is in an OV or UV condition.

Embodiments of the present disclosure can also be viewed as providing methods for overvoltage and undervoltage detection. In this regard, one embodiment of such a method, among others, can be broadly summarized by the following: setting a reference voltage using the reference circuit and a resistor divider; comparing the input voltage to the reference voltage with a coarse comparator circuit; and switching out a resistor of the resistor divider to reduce the input voltage to the reference circuit after determining that the input voltage is not in an UV condition, the resistor divider having been set to turn on the reference circuit when the input voltage is in an OV condition.

DETAILED DESCRIPTION

Figure 1:
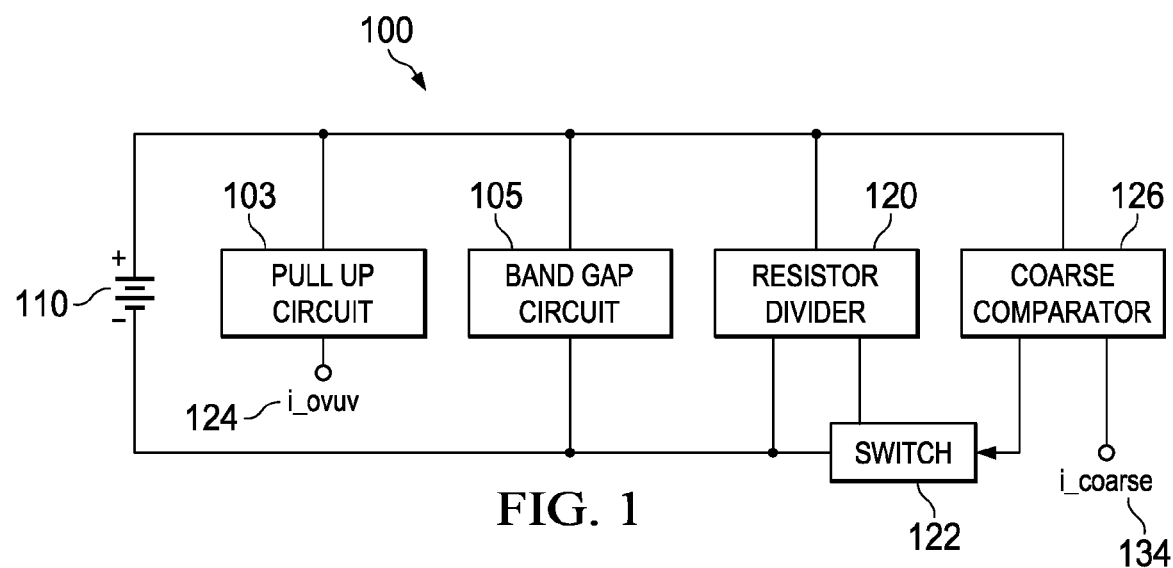
FIG. 1 is a block diagram of an example embodiment of a system of overvoltage and undervoltage detection.

Embodiments of the present disclosure will be described more fully hereinafter with reference to the accompanying drawings in which like numerals represent like elements throughout the several figures, and in which example embodiments are shown. Embodiments of the claims may, however, be embodied in many different forms and should not be construed as limited to the embodiments set forth herein. The examples set forth herein are non-limiting examples and are merely examples among other possible examples.

Overvoltage may be defined as a voltage above a maximum desired voltage. For instance, if the nominal voltage is 5V, an overvoltage condition may be defined as with a 10% margin, or 5.5V. Alternatively, the margin may be defined to be 20%, or 6V. Undervoltage may be defined as a voltage below a minimum desired voltage. For instance, if the nominal voltage is 5V, an undervoltage condition may be defined as with a 10% margin, or an undervoltage level of 4.5V. Alternatively, the margin may be defined to be 20%, or an undervoltage level of 4V. These levels may be dependent on the voltages sources used. For example, in batteries, the threshold voltages are determined by the battery chemistry, such as Li-ion, NiMH, and NiCad as non-limiting examples. There are many circuits to detect an overvoltage condition. And, there are many other circuits that detect an undervoltage condition.

This disclosure provides a solution to the problem of detecting an over voltage (OV) and under voltage (UV) condition of a cell using a single bandgap reference circuit. The circuit uses very low power and may operate using the cell voltage in a multi-cell stack. The power consumed may be constant and may be independent of the number of cells in the stack. For accurate detection that is valid across temperature, a band gap reference may be used. Typically, to detect both OV and UV conditions, two band gap references are used. However, the systems and methods of OV and UV detection disclosed herein may use a single band gap reference. Although a band gap reference is used as an example, other types of references may be used depending on the application. For example, if the application is not subjected to temperature variations, a Zener diode may be used.

Example embodiments of the disclosed systems and methods of overvoltage and undervoltage detection may be implemented with a fully differential circuit that includes a coarse comparator and a bandgap based fine comparator. The coarse comparator may determine if the battery is closer to an OV condition or an UV condition. Based on the output of the coarse comparator, the trip point of the fine comparator is adjusted. The outputs of both comparators are pull-up circuits whose output is decoded to determine if an OV or a UV condition has occurred.

Example embodiments of the disclosed systems and methods of overvoltage and undervoltage detection accomplish valid circuit outputs even when the voltage across the battery reduces to zero volts. This may be achieved by using an active low signal for the UV condition and an active high signal for the OV condition. Thus, when the battery voltage goes to zero, the circuit evaluates to the correct output.

In example embodiments, a single circuit may be used to detect both OV and UV conditions. Output is valid down to zero volts across the battery with low current consumption (for example, <1 uA) irrespective of the number of batteries in the battery stack.

Example embodiments of the disclosed systems and methods of overvoltage and undervoltage detection may be fully differential implementing a current (pull up) output. This allows the circuit to be operated between cell voltages and does not have to be ground referenced. The output current can then be transmitted and decoded by a ground referenced circuit. This is a key requirement in multi cell operations where hundreds of cells can be stacked in series.

In example embodiments, a single bandgap circuit is used for both OV and UV detection. The outputs are accurate across temperature as the threshold levels are based on a bandgap circuit. It is a real time solution as the cell voltage is monitored continuously (i.e. no sampling required). The output of the detector may be valid at all times. The power consumption of the circuit reduces with cell voltage. This hinders the battery from being drained by the circuit as the battery goes into an UV condition.

FIG. 1 provides a block diagram of a system for detecting OV and UV. Example embodiments of detection circuit 100 include pull-up circuit 103, bandgap circuit 105, resistor divider 120, coarse comparator 126, and switch 122 for detection of OV and UV conditions of voltage source 110. Voltage source 110 is depicted as a battery, but could be any voltage source, including but not limited to a super capacitor or other DC power supply. Coarse comparator 126 may provide current signal output i_coarse 134 for determining if the battery is closer to an OV condition or an UV condition. Output i_ovuv 124 provides an indication of an OV or UV condition.

Figure 2:
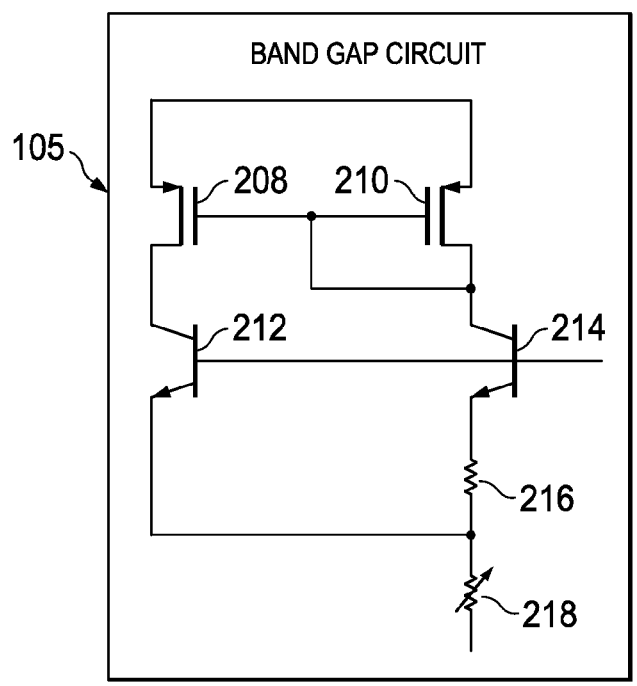
FIG. 2 is a circuit diagram of an example embodiment of a band gap circuit in the system of FIG. 1.

FIG. 2 provides a circuit diagram of an example embodiment of bandgap circuit 105. An example embodiment of band gap circuit 105 includes transistors, 212, 214, 208, 210, and resistors 216 and 218. Bandgap circuit 105 is turned on when the voltage at the base transistors 212, 214 as determined by the resistive divider 120 is at the bandgap voltage.

Figure 3:
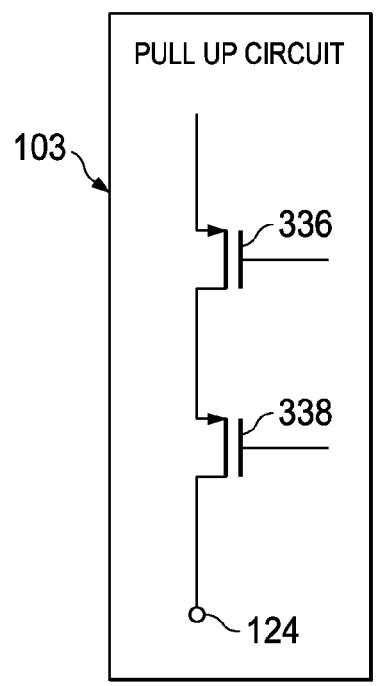
FIG. 3 is a circuit diagram of an example embodiment of a pull up circuit in the system of FIG. 1.
Figure 4:
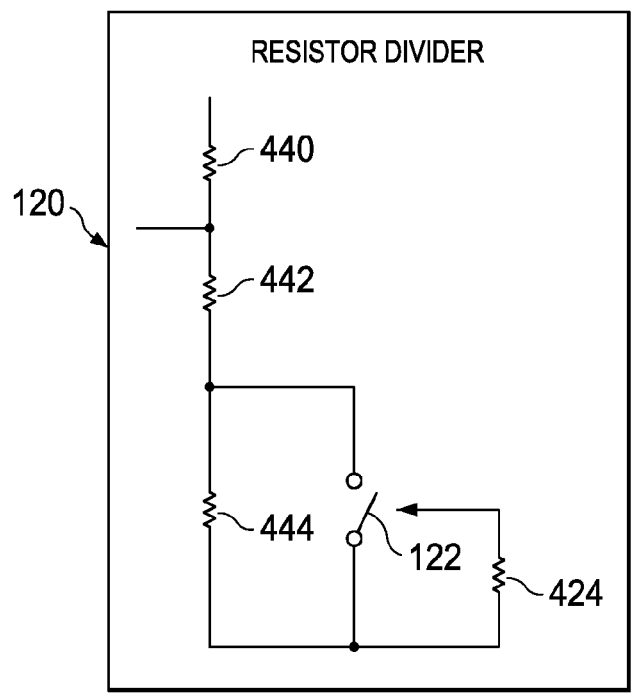
FIG. 4 is a circuit diagram of an example embodiment of a resistor divider circuit in the system of FIG. 1.

The resistive divider ratio may be changed using switch 122. As provided in FIG. 4, an example embodiment of resistor divider 120 includes resistors 440, 442, and 444. The output of bandgap circuit 105 is presented at i_ovuv 124 through pull up circuit 103. An example embodiment of pullup circuit 103, as provided in FIG. 3, includes cascoded current source comprising transistors 336 and 338.

Figure 5:
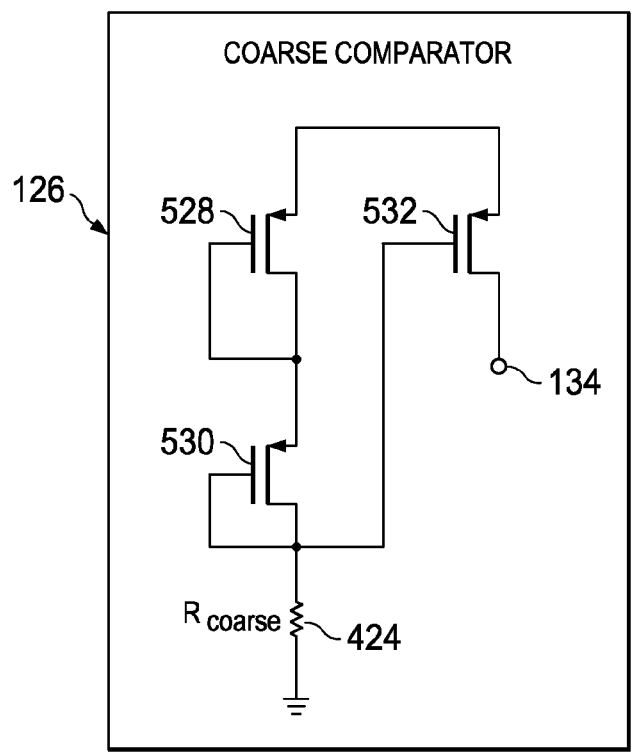
FIG. 5 is a circuit diagram of an example embodiment of a coarse comparator circuit in the system of FIG. 1.

FIG. 5 provides an example embodiment of coarse comparator 126, which includes transistors 528, 530 and resistor 424. The set point of the coarse comparator 126 is determined by diode connected transistors 528 and 530. The output of the coarse comparator 126 is a current signal and is available at the drain of transistor 532.

Figure 6:
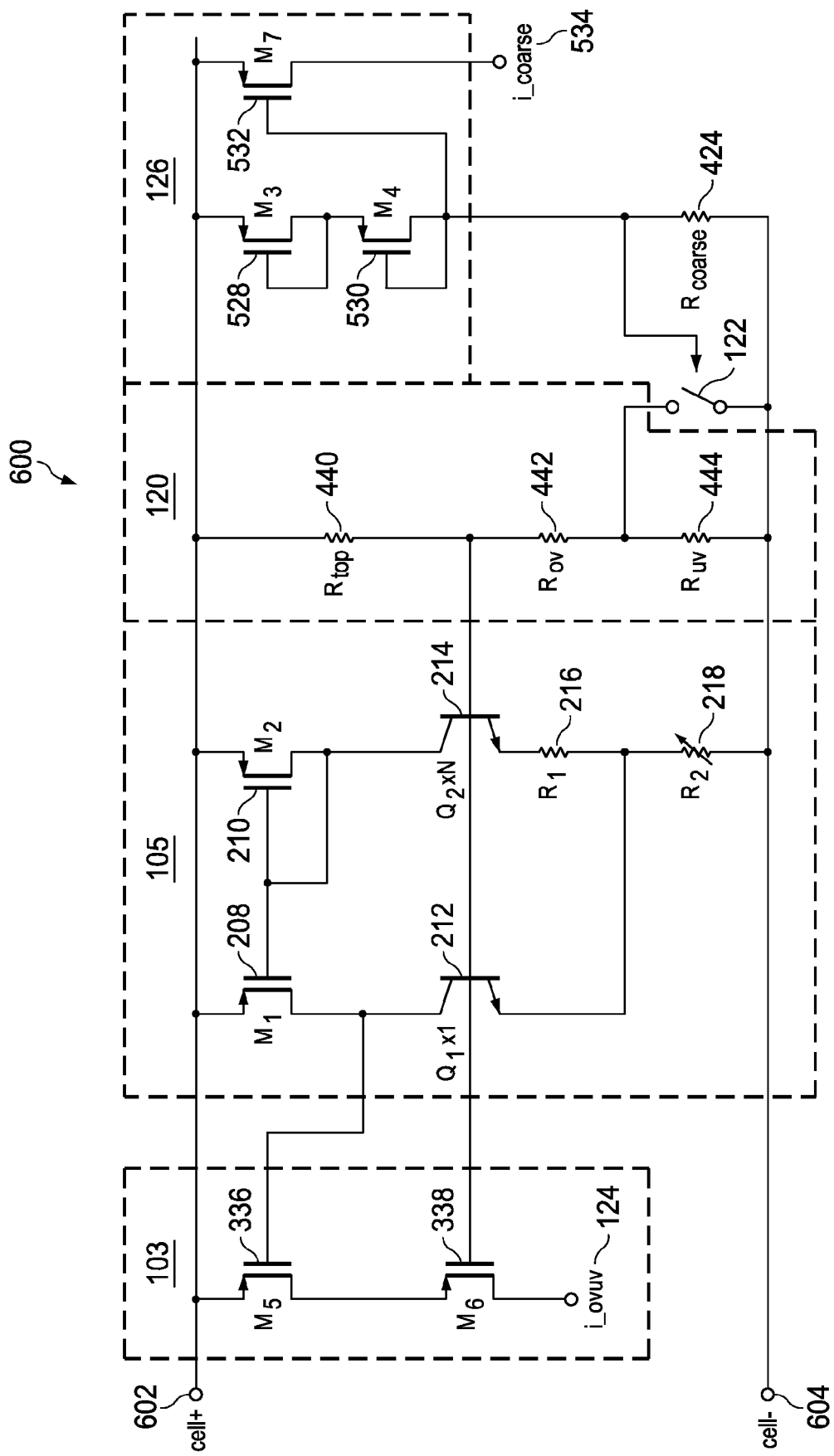
FIG. 6 is a detailed circuit diagram of an example embodiment of the system of FIG. 1.

FIG. 6 provides detailed circuit 600 in which the circuit of FIG. 1 is provided using the detailed components of FIGS. 2-5. Initially, as cell voltage 602 referenced from negative cell voltage 604 starts from zero volts, switch 122 is open. Coarse comparator 126 evaluates to logic 0 at output 534 and output 124 of bandgap 105 through pull up circuit 103 is also logic 0. This condition, in which both coarse comparator output 534 and band gap output 124 are logic 0, is decoded as a UV condition.

As cell voltage 602 increases, band gap circuit 105 is turned on. At this point, the band gap output 124 is logic 1. The cell is in a valid region of operation under this condition. As cell voltage 602 continues to increase, coarse comparator 126 trips and evaluates to logic 1. This turns on switch 122 and shunts out $R_{uv}$ 444. This reduces the input to band gap circuit 105. Band gap circuit 105 turns off and evaluates to logic 0. This is also a valid region of operation for the cell. Finally, when the cell voltage 602 rises to an OV condition, band gap circuit 105 turns back on and evaluates to logic 1.

In terms of a truth table, as the cell voltage is increased, it is

Coarse Comparator=0, Band Gap=0=>UV
Coarse Comparator=0, Band Gap=1=>No Fault
Coarse Comparator=1, Band Gap=0=>No Fault
Coarse Comparator=1, Band Gap=1=>OV Thus, circuit 600 detects both OV and UV conditions. It uses a single band gap reference. It operates on the cell voltage and the current consumption is extremely low (<1 uA). It evaluates to the correct logic signal when the voltage across the cell drops to 0V. The power consumed by the circuit reduces as the cell voltage reduces.

Figure 7:
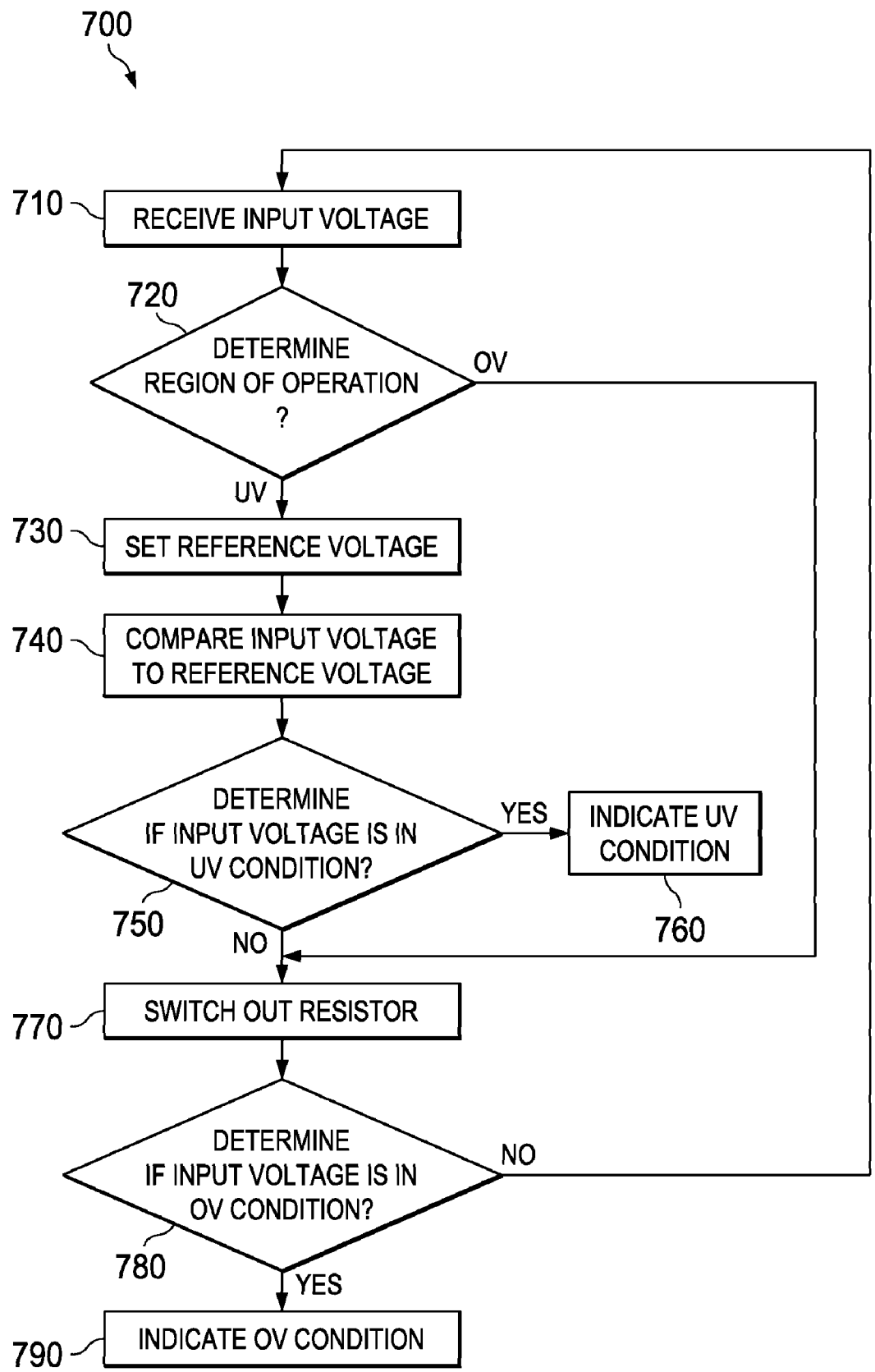
FIG. 7 is a flow diagram of an example embodiment of a method of overvoltage and undervoltage detection.

FIG. 7 provides a flow diagram of method 700, an example embodiment for detecting undervoltage and overvoltage. In block 710, An input voltage is received. In block 720, the input voltage is examined and a determination is made as to whether the input voltage is closer to an UV condition or an OV condition. If the input voltage is in an UV region of operation, the reference voltage is set in block 730. In the case of the band gap reference, this is performed by opening switch 122 to include resistor 444 into resistor divider 120. In block 740, the input voltage is compared to the reference voltage. In block 750, a determination is made of whether the input voltage is in an UV condition.

If it is in an UV condition, the UV condition is indicated in block 760. If, in block 750, the input voltage is determined to not be in an UV condition, resistor 444 is switched out of resistor divider 120 by closing switch 122. In block 780, a determination is made of whether the input voltage is in an OV condition. If the input voltage is in an OV condition, the OV condition is indicated in block 790. If the input voltage is not in an OV condition, the region of operation is again determined in block 720.

Therefore, at least the following is claimed:

1. An analog circuit for detecting both overvoltage (OV) and undervoltage (UV) conditions comprising:
    a band gap reference circuit for setting a reference voltage;
    a voltage input electrically coupled to the band gap circuit;
    a coarse comparator electrically connected to the reference circuit, the coarse comparator for determining if the voltage input is closer to an OV condition or a UV condition;
    a resistor divider for setting a reference voltage for the coarse comparator; and
    a pull up circuit for presenting an output of the reference circuit, the output of the reference circuit indicative of whether the input voltage is in an OV or UV condition.

2. The circuit of claim 1, wherein the reference circuit comprises two transistors having their bases/gates connected to each other electrically connected to two transistors having their bases/gates connected to each other.

3. The circuit of claim 2, wherein the voltage at the bases/gates of the transistors is determined by the resistor divider.

4. The circuit of claim 3, wherein the reference circuit is turned on when the voltage at the base of the transistors is at a threshold voltage.

5. The circuit of claim 1, wherein the pull up circuit comprises a cascoded current source.

6. The circuit of claim 1, wherein the resistor divider comprises three resistors, a top resistor, an OV resistor, and a UV resistor, and a switch which switches out the UV resistor when the switch is closed.

7. The circuit of claim 1, wherein outputs of the coarse comparator and the pull up circuit are current logic signals.

8. The circuit of claim 1, wherein an output of the coarse comparator indicates an UV condition when the output of the coarse comparator is 0 and an output of the reference circuit is 0.

9. The circuit of claim 1, wherein an output of the reference circuit indicates an OV condition when the output of the coarse comparator is 1 and the output of the reference circuit is 1.

10. The circuit of claim 1, wherein the reference circuit is a band gap reference circuit.

11. A method of determining both overvoltage (OV) and undervoltage (UV) conditions for an input voltage using a single reference analog circuit, the method comprising:
    setting a reference voltage using the reference circuit and a resistor divider;
    comparing the input voltage to the reference voltage with a coarse comparator circuit; and
    switching out a resistor of the resistor divider to reduce the input voltage to the reference circuit after determining that the input voltage is not in an UV condition, the resistor divider having been set to turn on the reference circuit when the input voltage is in an OV condition.

12. The method of claim 11, further comprising producing a signal indicative of the input voltage being closer to a UV condition than an OV condition.

13. The method of claim 12, wherein the producing a signal indicative of the UV condition indicates an UV condition when a resultant output of the coarse comparator circuit is 0 and a resultant output of the reference circuit is 0.

14. The method of claim 11, further comprising producing a signal indicative of the reference circuit being turned on.

15. The method of claim 14, wherein the producing a signal indicator indicative of the OV condition indicates an OV condition when a resultant output of the coarse comparator is 1 and a resultant output of the reference circuit is 1.

16. The method of claim 11, wherein the reference circuit is a band gap reference circuit.

17. A method of determining both overvoltage (OV) and undervoltage (UV) conditions for an input voltage using a single reference analog circuit, the method comprising:
    comparing an input voltage to a coarse reference voltage generated in a reference circuit using a coarse comparator;
    producing an undervoltage indicator reflecting a resultant output from the coarse comparator and the reference circuit; and
    producing an overvoltage indicator reflecting a resultant output of the reference circuit and the coarse comparator.

18. The method of claim 17, wherein the producing of the undervoltage indicator indicates an undervoltage condition when both the resultant output of the coarse comparator is 0 and the resultant output of the reference circuit is 0.

19. The method of claim 17, wherein the producing of the overvoltage indicator indicates an overvoltage condition when both the resultant output of the coarse comparator is 1 and the resultant output of the reference circuit is 1.

20. The method of claim 17, wherein the reference circuit is a band gap reference circuit.

* * * * *